US011166401B2

(12) United States Patent
Lewis et al.

(10) Patent No.: US 11,166,401 B2
(45) Date of Patent: Nov. 2, 2021

(54) DYE AND PRY PROCESS FOR SURFACE MOUNT TECHNOLOGY DUAL IN-LINE MEMORY MODULE

(71) Applicant: International Business Machines Corporation, Armonk, NY (US)

(72) Inventors: Theron Lee Lewis, Rochester, MN (US); David Braun, St. Charles, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 258 days.

(21) Appl. No.: 16/398,676

(22) Filed: Apr. 30, 2019

(65) Prior Publication Data
US 2020/0352068 A1    Nov. 5, 2020

(51) Int. Cl.
*G01R 31/28* (2006.01)
*H05K 13/04* (2006.01)
(Continued)

(52) U.S. Cl.
CPC ......... *H05K 13/0486* (2013.01); *G01N 21/91* (2013.01); *H01R 12/737* (2013.01); *H05K 1/181* (2013.01); *H05K 2201/10189* (2013.01)

(58) Field of Classification Search
CPC ............... H05K 1/181; H05K 13/0486; H05K 2201/10159; H05K 2201/10189;
(Continued)

(56) References Cited

U.S. PATENT DOCUMENTS 5,651,493 A    7/1997   Bielick et al.
7,354,281 B1 *  4/2008   Brodsky ............ H01R 12/7011
                                                   439/78
(Continued)

FOREIGN PATENT DOCUMENTS

CN    102441865 A    5/2012
CN    102922477 A    2/2013
CN    204190015 U    3/2015

OTHER PUBLICATIONS

Bhanu Sood, "Achieving Improved Reliability with Failure Analysis" Bhanu Soodipc High Reliability Forum, Linthicum, MD May 15, 2018; pp. 1-234.
(Continued)

*Primary Examiner* — Paul D Kim
(74) *Attorney, Agent, or Firm* — Cantor Colburn LLP; Tihon Poltavets

(57) ABSTRACT

Embodiments of the invention include a dye and pry process for removing a surface mount technology (SMT) dual in-line memory module (DIMM) from card assemblies. Aspects of the invention include immersing a semiconductor package assembly in a solution comprising dye and placing the immersed semiconductor package assembly under vacuum pressure. Vacuum conditions ensure that the dye solution is pulled into any cracks in the solder formed between the semiconductor package assembly and the SMT DIMM. The package assembly is dried, and a dummy card stock is installed in the SMT DIMM using an epoxy. The SMT DIMM is then removed by applying a force to an exposed cavity between the dummy card stock and the semiconductor package assembly. The semiconductor package assembly and the SMT DIMM can then be inspected for the dye to locate cracks.

13 Claims, 7 Drawing Sheets

(51) Int. Cl.
*G01N 21/91* (2006.01)
*H05K 1/18* (2006.01)
*H01R 12/73* (2011.01)

(58) Field of Classification Search
CPC .. H05K 3/225; H05K 2203/176; G01N 21/91; G01N 2021/95646; H01R 12/737
See application file for complete search history.

(56) References Cited

U.S. PATENT DOCUMENTS

| | | | | |
|---|---|---|---|---|
| 7,361,983 | B2 * | 4/2008 | Hayashi | H01L 23/49541 257/666 |
| 7,393,244 | B1 * | 7/2008 | Brodsky | H01R 12/7029 439/567 |
| 7,396,244 | B1 * | 7/2008 | Barna | H05K 7/1409 29/759 |
| 8,063,656 | B1 | 11/2011 | Ubaldo et al. | |
| 8,419,447 | B2 * | 4/2013 | Freedman | H01R 13/6608 439/83 |
| 8,559,181 | B2 * | 10/2013 | Clayton | H05K 1/189 361/749 |
| 8,638,564 | B2 | 1/2014 | Buschel et al. | |
| 10,262,907 | B1 * | 4/2019 | Bartsch | H01L 21/4842 |
| 2008/0220624 | A1 * | 9/2008 | Brodsky | H01R 12/7047 439/55 |

OTHER PUBLICATIONS

"Dye and Pull Test Method (Formerly Known as Dye and Pry)" IPC-TM-650 Test Methods Manual No. 2.4.53; Date Aug. 2017; pp. 1-11.

* cited by examiner

DYE AND PRY PROCESS FOR SURFACE MOUNT TECHNOLOGY DUAL IN-LINE MEMORY MODULE

BACKGROUND

The present invention generally relates to equipment for testing semiconductor devices, and more specifically, to a dye and pry process for evaluating a surface mount technology (SMT) dual in-line memory module (DIMM).

Most integrated circuit components that are attached to a printed circuit board (PCB) are attached using mechanical means, such as soldering. In the past, when devices were relatively simple and included only a few leads going from each component to the board, a visual inspection could be made to determine whether the component-to-board bonding had been adequate and whether a good mechanical connection had been obtained with proper solder flow. This type of inspection is suitable, for example, to Land Grid Array (LGA) wiring/pad designs for silicon chip interconnections and Ball Grid Array (BGA) and Column Grid Array (CGA) type modules for silicon chip attachment or first level package attachment to a second level board electronic packaging assembly. Conventional SMTs, however, are far more complicated and densely packed than legacy packages. A visual inspection of SMTs is not sufficient for a thorough analysis.

Conventional SMTs are typically assessed using a destructive dye and pry technique. The "dye and pry" technique relies on a liquid dye that penetrates into existing micro cracks or under open solder balls to reveal defects on the connector interface. This technique is a destructive test that requires the tested package to be submerged in dye and then baked at a relatively high temperature until the dye has set. Once set, the extent that the dye has penetrated the package or connector can be determined.

SUMMARY

Embodiments of the invention are directed to a dye and pry process for removing a surface mount technology (SMT) dual in-line memory module (DIMM) from card assemblies. Aspects of the invention include immersing a semiconductor package assembly in a solution comprising dye and placing the immersed semiconductor package assembly under vacuum pressure. Vacuum conditions ensure that the dye solution is pulled into any cracks in the solder formed between the semiconductor package assembly and the SMT DIMM. The package assembly is dried, and a dummy card stock is installed in the SMT DIMM using an epoxy. The SMT DIMM is then removed by applying a force to an exposed cavity between the dummy card stock and the semiconductor package assembly. The semiconductor package assembly and the SMT DIMM can then be inspected for the dye to locate cracks.

Embodiments of the invention are directed to a method for removing a SMT DIMM from a printed circuit board (PCB). Aspects of the invention include applying an epoxy to a connector mating slot of the SMT DIMM and installing a dummy card stock into the connector mating slot of the SMT DIMM while the epoxy is in an uncured state. The epoxy is cured and a connector end component of the SMT DIMM is removed to expose a cavity between the dummy card stock and the PCB. A force is applied to the exposed cavity to remove the SMT DIMM from the PCB.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Figure 1:
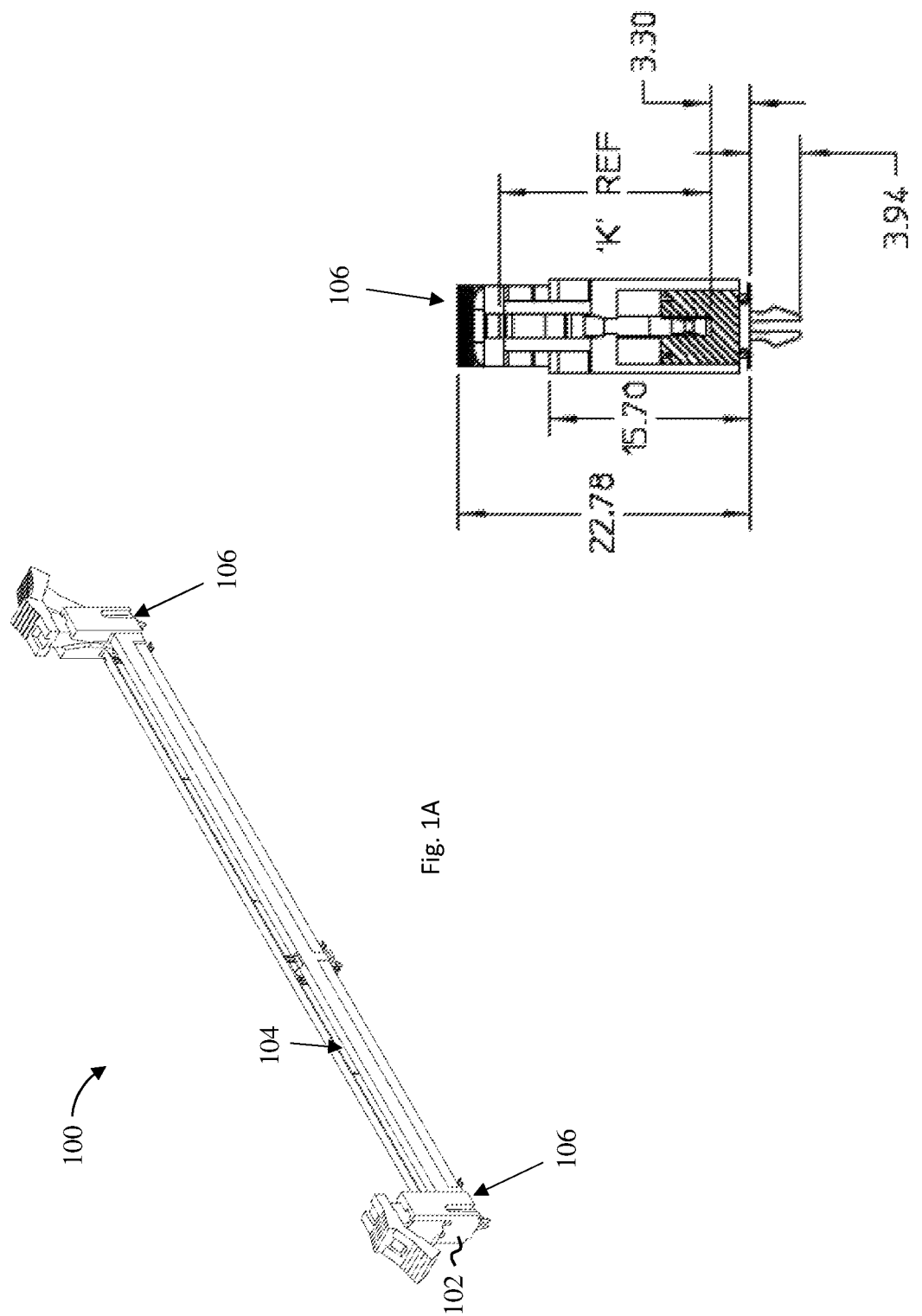
FIG. 1A depicts an isometric view of a SMT DIMM according to one or more embodiments of the invention.
FIG. 1B depicts a plan view of the SMT DIMM of FIG. 1A taken along an end of the SMT DIMM according to one or more embodiments of the invention.

Turning now to an overview of technologies that are more specifically relevant to aspects of the present invention, an isometric view of a surface mount technology (SMT) dual in-line memory module (DIMM) 100 is shown in FIG. 1A. A plan view taken at an end of the SMT DIMM 100 of FIG. 1A is shown in FIG. 1B. The purpose of a SMT DIMM connector is to provide an electrical connection between a DIMM Memory cardlet and a main printed circuit board assembly (PCBA) (not shown). In general, Random Access Memory (RAM) is installed into the SMT DIMM 100.

As shown in FIG. 1A, the SMT DIMM 100 includes a housing 102 made from an insulative material, for example, a liquid crystal polymer. The housing 102 can include one or more slots 104 which are dimensioned to receive a leading edge portion of a respective DIMM Memory cardlet (also referred to as a daughtercard or memory card). The slots 104 extend between opposite ends of the housing 102. The ends of the housing 102 can include sockets (also referred to as gull wings, or lands) 106 which receive side edges of the memory card and serve as card guides for stabilizing the memory card in the slots 104. In some embodiments of the invention, metal spring probes are provided within the housing 102. These probes can be configured to contact a DIMM memory cardlet during insertion into the slots 104. In some embodiments of the invention, the SMT DIMM 100 includes two rows of gull wing leaded SMT leads that attach to metal spring probes within the slots 104.

As shown in FIG. 1B, the SMT DIMM 100 includes one or more leads 108 that extend to an exterior of the housing 102 for electrically engaging respective circuit traces on a mothercard substrate such as by conventional surface mount or through-hole solder techniques (not shown). FIG. 1B is further shown with example sizing dimensions for ease of illustration, although other configurations are within the contemplated scope of the invention.

As discussed previously herein, conventional dye and pry techniques are highly destructive, making a detailed dye ingress examination of the SMT DIMM 100 difficult or impossible. For example, when just implementing a conventional dye and pry with no other technique, the sample SMT DIMM housing/plastic often breaks into smaller pieces, making monolithic analysis of the connector impossible. In addition, the many metal contacts of the SMT DIMM need to be pulled off one by one making the process both time consuming and difficult.

Turning now to an overview of aspects of the present invention, one or more embodiments of the invention address the above-described shortcomings of the prior art by providing a new method for performing dye and pry successfully on SMT DIMM connectors in conjunction with standard dye and pry techniques. The method includes submerging a sample having one or more SMT DIMM connectors into a dye solution and baking or otherwise curing the dye. After the dye operation, the SMT DIMM connectors are filled with epoxy and a dummy solid card structure (dummy card) is installed into each of the connectors before the epoxy hardens. The dummy card is sized to ensure that all metal contacts inside the connector are covered. Once the epoxy hardens, a pry technique is used to completely lift the entire connector off of the underlying PCB pads, leaving behind the solder joints without any connector pins soldered to them. The solder joints and connector can them be examined for dye ingress. Advantageously, this technique ensures that the SMT DIMM connector is stabilized following the dye and pry process and leaves a monolithic structure (i.e., the full connector structure) that can be analyzed wholesale once the connector is pried off.

Figure 2:
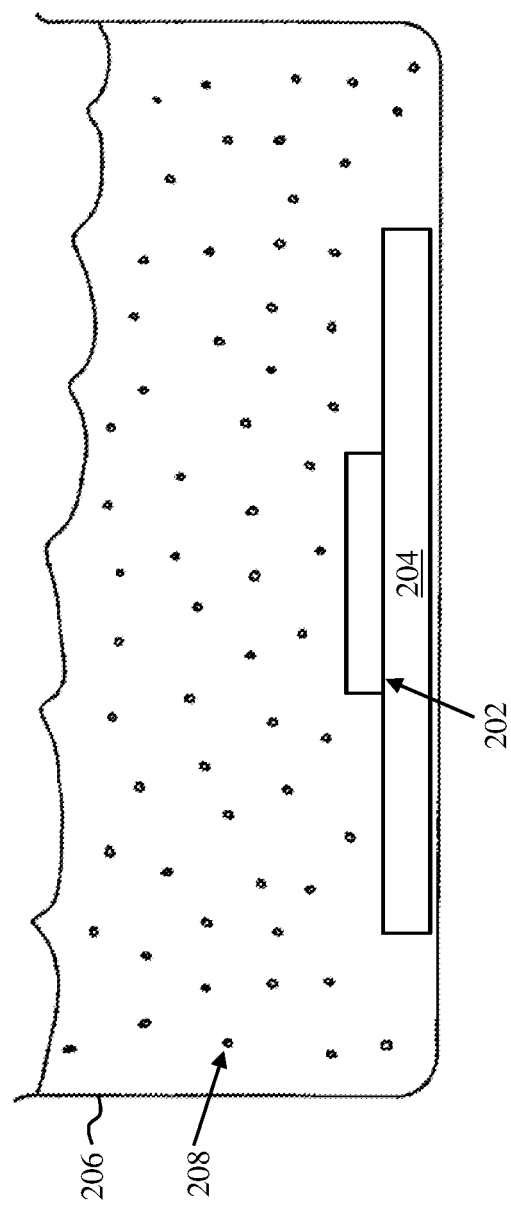
FIG. 2 depicts a cross-sectional view of a PCB having one or more SMT DIMMs submerged in dye according to one or more embodiments of the invention.

Turning now to a more detailed description of aspects of the present invention, FIG. 2 depicts a cross-sectional view of one or more SMT DIMMs 202 coupled to an underlying PCB 204 according to one or more embodiments of the invention. As depicted in FIG. 2, the PCB 204 and the SMT DIMMs are placed in a container 206, such as a beaker or a petri dish, and are immersed in a solution of dye 208. Prior to immersion, the PCB 204 can be cut to any required sample size. The maximum sample size can be limited by equipment (e.g., dye pan size). The PCB 204 can be cut using any suitable technique known for cutting circuit boards without causing excessive vibrations on solder joints. For example, the PCB 204 can be cut using a diamond saw to minimize vibrations on joints of the PCB 204 and/or SMT DIMMs 202.

In some embodiments of the present invention, the PCB 204 is pre-cleaned prior to immersion. For example, flux residues can be removed from the PCB 204 using any suitable process. The pre-clean process can include, for example, a polar solvent or a solution of water and saponifier and ensures that any flux residue on the PCB 204 (resulting from, e.g., a no clean soldering process) is removed prior to immersion. Flux can cause false calls and can prevent dye ingress into cracks. In some embodiments of the present invention, the PCB 204 is pre-cleaned using a cleaning mixture of 75% isopropyl alcohol and 25% water. To help remove the flux, the cleaning mixture can be heated and agitated. In some embodiments of the present invention, the cleaning mixture is heated to a temperature of between 50 and 70 degrees Celsius. In some embodiments of the present invention, the PCB 204 is soaked in the cleaning mixture for several hours (e.g., 2-3 hours or longer).

After pre-cleaning, the PCB 204 and SMT DIMMs 202 are immersed in the solution of dye 208. The dye 208 can be any dye suitable for dye and pry processing, such as, for example, red tracer dye. In some embodiments of the present invention, the dye 208 material is selected such that the dye 208 can be easily photographed with white light. As depicted, the PCB 204 and SMT DIMMs 202 are fully immersed in the dye 208. Alternatively, the PCB 204 and SMT DIMMs 202 can be partially immersed while only a portion of interest is wholly immersed.

In some embodiments of the present invention, the submerged PCB 204 and SMT DIMMs 202 are put in a conventional vacuum chamber oven. Vacuum conditions allow for the dye 208 to be pulled into any cracks that exist in the solder, bonding pads, and/or connector contacts/leads. In some embodiments of the present invention, the PCB 204 and SMT DIMMs 202 are placed under a vacuum of about 27 inches of mercury for about 10 minutes, although other vacuum pressures and durations are within the contemplated scope of the invention. In some embodiments of the present invention, the PCB 204 and SMT DIMMs 202 are left under vacuum conditions for more than an hour, such as, for example, 4 or 8 hours.

After the PCB 204 and SMT DIMMs 202 are dyed, the PCB 204 is pulled from the container 206 and the excess dye 208 is blown off. The PCB 204 is then placed in an oven for baking. Baking ensures that the dye 208 that has penetrated cracks in the PCB 204 or SMT DIMMs 202 properly sets. The baking temperature can be adjusted based on the sensitivity of the samples tested.

In some embodiments of the present invention, the PCB 204 and SMT DIMMs 202 are baked at a temperature of about 90 to about 120 degrees Celsius, although other baking temperatures are within the contemplated scope of the invention. The total baking time varies depending on the sample to be tested. In some embodiments of the present invention, the PCB 204 and SMT DIMMs 202 are baked for a minimum of 8 hours. In some embodiments of the present invention, the PCB 204 and SMT DIMMs 202 are baked for 8 to 24 hours, or for more than at least 24 hours, although other baking times are within the contemplated scope of the invention. After baking, the PCB 204 and SMT DIMMs 202 are allowed to cool to room temperature.

Figure 3:
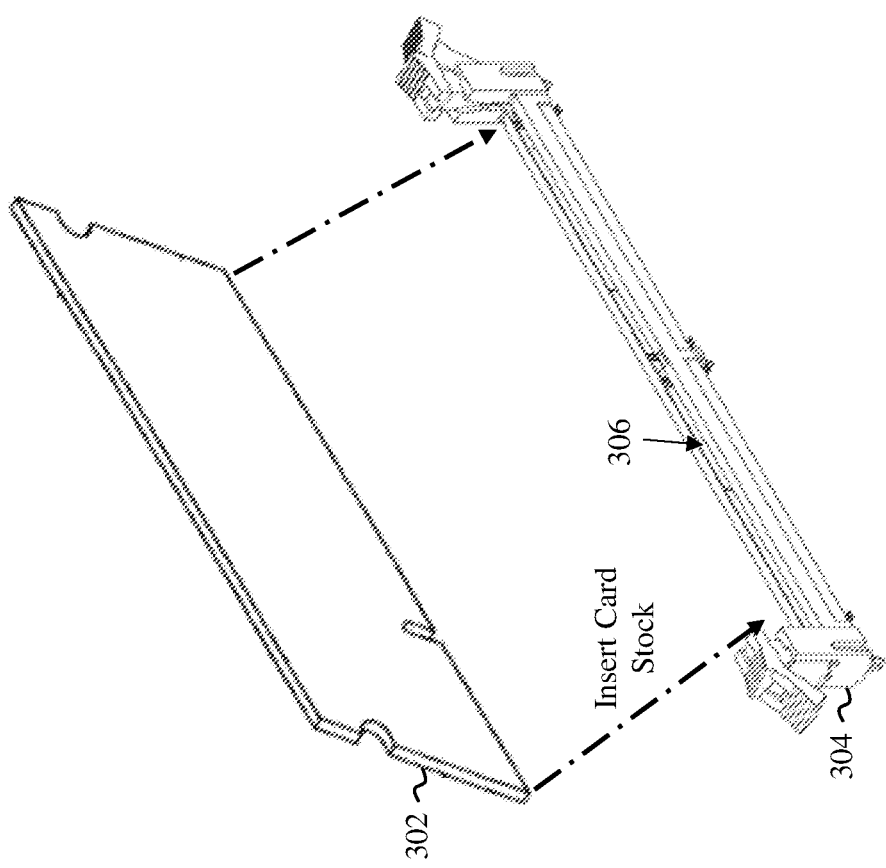
FIG. 3 depicts a cross-sectional view of a card stock being inserted into a SMT DIMM according to one or more embodiments of the invention.

FIG. 3 depicts a cross-sectional view of a card stock 302 being inserted into a SMT DIMM 304 according to one or more embodiments of the invention. In some embodiments of the invention, the card stock 302 is inserted into the SMT DIMM 304 after submerging the SMT DIMM 304 in dye and baking the SMT DIMM 304 to set the dye as described previously herein with respect to FIG. 2.

After the dye has set, but prior to inserting the card stock 302, the SMT DIMM 304 and any underlying circuit board (not shown) can be prepared for a pry operation. In some embodiments of the invention, the SMT DIMM 304 is placed over wax paper and/or aluminum foil or similar media so the residuals of the following epoxy/molding material (collectively referred to as epoxy) can be easily disposed.

In some embodiments of the invention, an epoxy is prepared for the SMT DIMM 304. The epoxy material can include, for example, an epoxy resin and polymercaptan hardener having a hardener specific gravity of about 1.04 and a resin specific gravity of about 1.17, although other epoxies are within the contemplated scope of the invention. Once prepared, the epoxy can be applied to the top of the SMT DIMM 304 and within any cavities and slots of the connector. In some embodiments of the invention, the epoxy is a liquid that completely fills the SMT DIMM 304 connector mating slot 306.

In some embodiments of the invention, the card stock 302 (also referred to as a solid card structure or dummy card) is inserted vertically into the connector mating slot 306 while the epoxy is still in a non-cured state. The card stock 302 material can include, for example, an FR-4 based laminate, although other materials are within the contemplated scope of the invention. The card stock 302 can be cut or otherwise sized to lengths that would fit the dimensions of the connector mating slot 306.

In some embodiments of the invention, a thickness of the card stock 302 can be adjusted based on a width of the connector mating slot 306 to ensure that all metal contacts inside the SMT DIMM 304 are covered by the card stock 302. In other words, the thickness of the card stock 302 can be adjusted to ensure that the card stock 302 is thin enough to fit within the connector mating slot 306, but thick enough to completely cover all metal contacts inside the SMT DIMM 304.

Once the card stock 302 is fit within the connector mating slot 306, the epoxy is cured. In some embodiments of the invention, the epoxy is cured for at least 2, 4, 8, 12, or 12 hours, although other curing durations are within the contemplated scope of the invention. In this manner, the card stock 302 is physically bonded to the connector mating slot 306.

Figure 4:
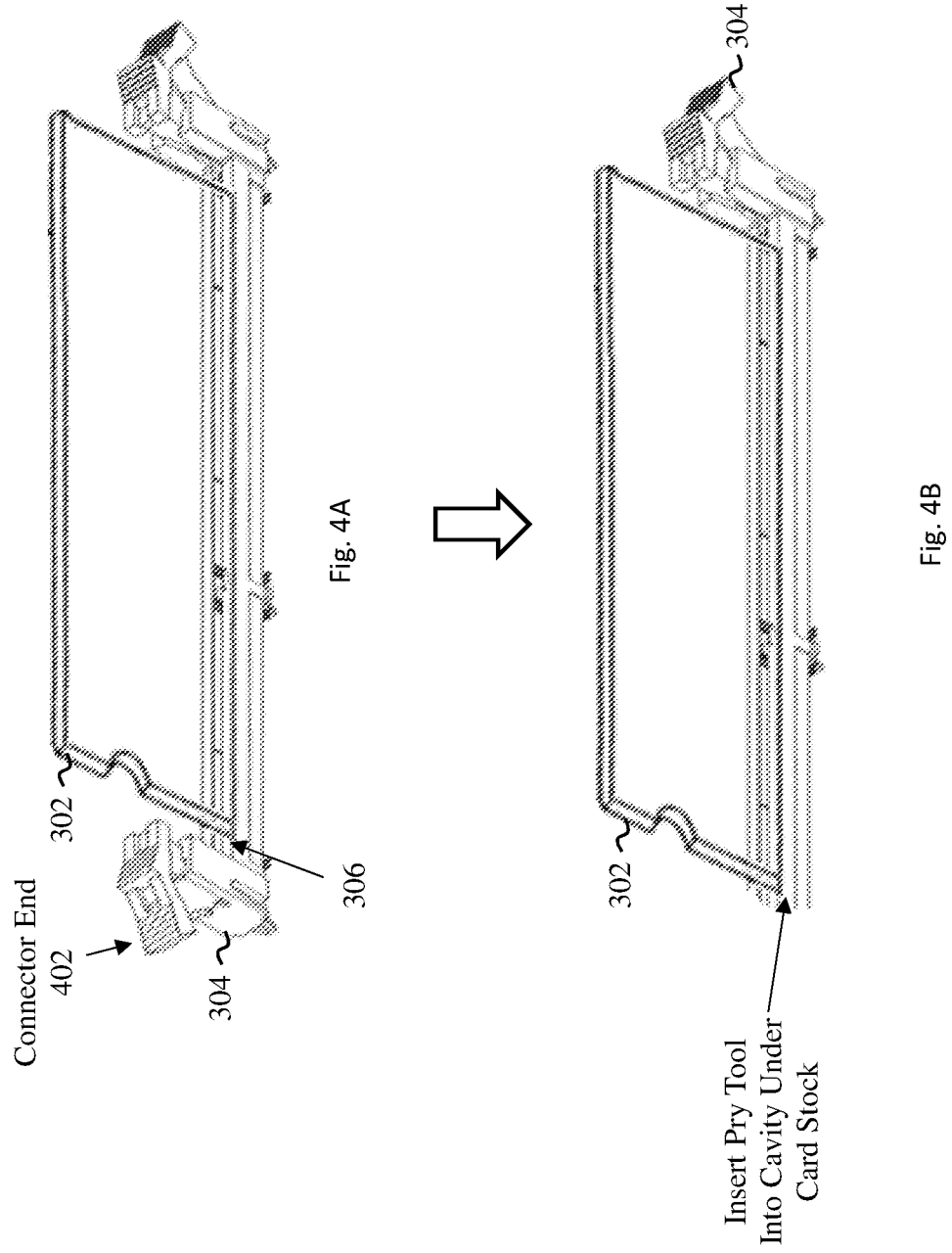
FIG. 4A depicts a cross-sectional view of a SMT DIMM after curing an epoxy with a card stock positioned in a connector mating slot of the SMT DIMM according to one or more embodiments of the invention.
FIG. 4B depicts a cross-sectional view of a SMT DIMM after removing a connector end according to one or more embodiments of the invention.

FIG. 4A depicts a cross-sectional view of the SMT DIMM 304 after curing with the card stock 302 positioned in the connector mating slot 306 according to one or more embodiments of the invention. In some embodiments of the invention, a connector end 402 of the SMT DIMM 304 is removed to expose a cavity (e.g., a portion of the connector mating slot 306) under the card stock 302. The connector end 402 can include, for example, a forklock, a plated through-hole (PTH) solder joint, or any other SMT feature configured to provide mechanical strain relief for the SMT DIMM 304.

In some embodiments of the invention, the connector end 402 and any other SMT features are removed/broken from the SMT DIMM 304 before a pry operation. Multiple methods can be used to remove these features, for example, pliers or a specialized tool can be used to break off the connector end 402 as well as any additional SMT features. In this manner, a center portion of the SMT DIMM 304 is exposed.

FIG. 4B depicts a cross-sectional view of the SMT DIMM 304 after removing the connector end 402 according to one or more embodiments of the invention. In some embodiments of the invention, a specialized pry operation is used to remove the SMT DIMM 304 from a wafer or substrate surface (wafer not shown).

In some embodiments of the invention, a pry tool (e.g., flat blade screw driver, wedge, etc.) is inserted under the exposed center portion of the SMT DIMM 304. In some embodiments of the invention, the pry tool is tapped (using, e.g., a small plastic hammer) or otherwise positioned under the card stock 302 to the location of a DIMM card location nub that is in the connector mating slot 306. A sudden or controlled load can be applied to the pry tool to prepare the SMT DIMM 304 for removal. In some embodiments of the present invention, the load is applied using a machine with a load cell. In this manner, the force applied to the SMT DIMM 304 can be monitored to provide analytical data.

Once completed for a first side of the SMT DIMM 304, the process is repeated for the other side. For example, a connector end and any other SMT features are removed/broken from the other side of the SMT DIMM 304, the pry tool is inserted into the cavity, and a force is applied in the exposed portion of the connector mating slot 306 under the card stock 302.

Once completed for both sides, the SMT DIMM 304 will lift completely off pads of the underlying substrate or PCB, leaving only solder joints without any connector pins soldered to them. Advantageously, removing the SMT DIMM 304 in this manner preserves the monolithic shape of the SMT DIMM 304 and the underlying solder joint structure for analysis.

Figure 5:
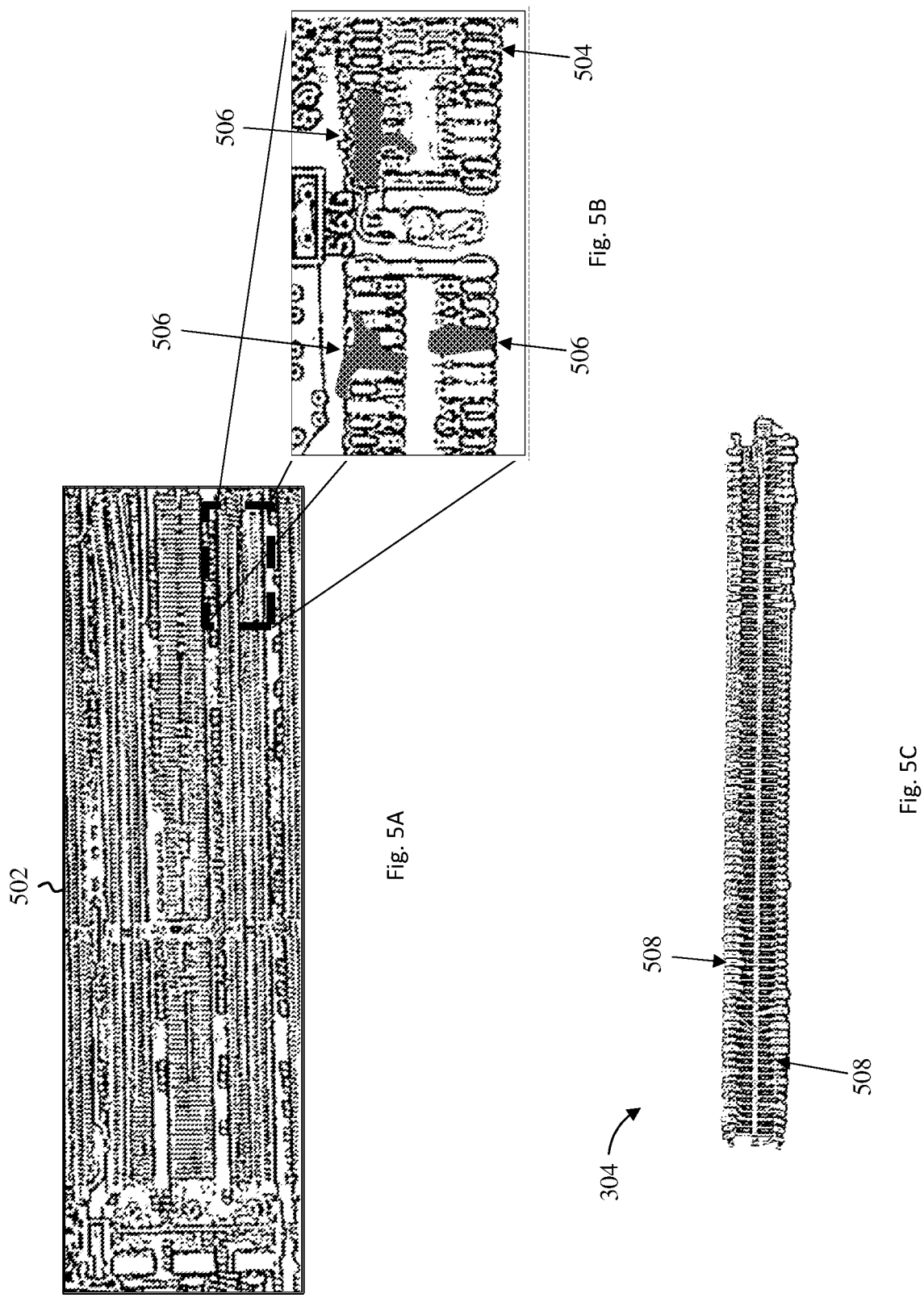
FIG. 5A depicts a top-down view of a PCB after removing a SMT DIMM according to one or more embodiments of the invention.
FIG. 5B depicts a top-down view of a portion of the PCB of FIG. 5A after removing a SMT DIMM according to one or more embodiments of the invention.
FIG. 5C depicts a top-down view of a SMT DIMM after removing the SMT DIMM from a PCB according to one or more embodiments of the invention.

FIGS. 5A, 5B, and 5C depict top-down views of a PCB 502 and a bottom surface of the SMT DIMM 304 after removing the SMT DIMM 304 using the specific pry operation discussed with respect to FIGS. 4A and 4B according to one or more embodiments of the invention. The surface of the PCB 502 and the bottom surface of the SMT DIMM 304 can now be analyzed for signs of die ingress into, e.g., damaged solder joints.

As shown in FIG. 5B, the surface of the PCB 502 that was under the SMT DIMM 304 is now exposed and reveals a plurality of bottomside contacts 504. These bottomside contacts 504 provided electrical contact between the SMT DIMM 304 and the PCB 502. As further depicted in FIG. 5B, the dye 208 has covered regions 506 of one or more of the bottomside contacts 504, indicating dye ingress into cracks in some of the solder joints between the PCB 502 and the SMT DIMM 304. As depicted in FIG. 5C, the bottom surface of the SMT DIMM 304, including the connector pins 508, can also be inspected for dye ingress.

Figure 6:
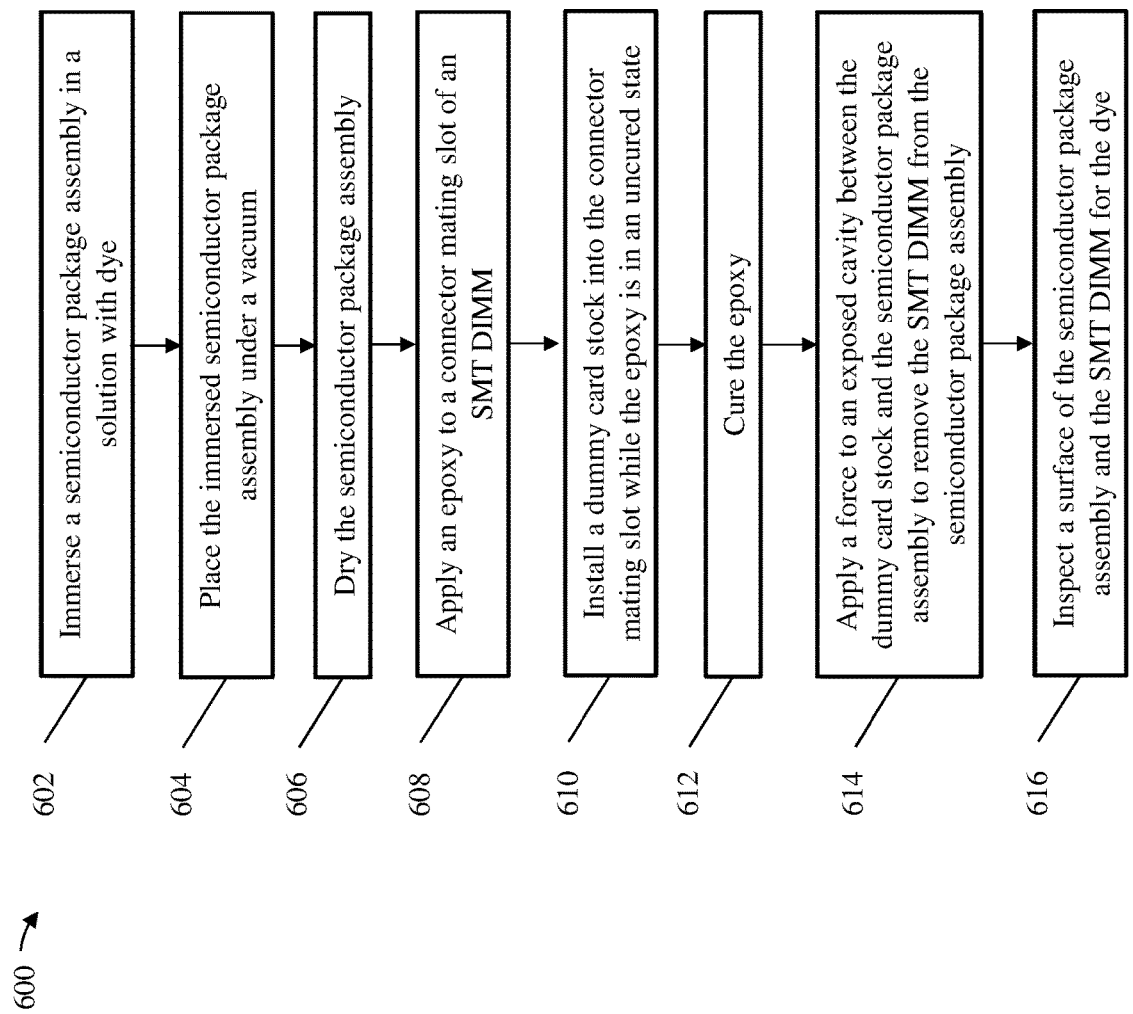
FIG. 6 depicts a flow diagram illustrating a method according to one or more embodiments of the invention.

FIG. 6 depicts a flow diagram 600 illustrating a method for a dye and pry process for evaluating a SMT DIMM according to one or more embodiments of the invention. As shown at block 602, a semiconductor package assembly having an SMT DIMM is immersed in a solution comprising dye, such as red tracer dye.

At block 604, the immersed semiconductor package assembly is placed under a vacuum. Vacuum conditions ensure that, when cracks exist in solder formed between the semiconductor package assembly and the SMT DIMM, the dye solution is pulled into the cracks. In some embodiments of the invention, the vacuum includes a vacuum pressure of about 27 inches of mercury (Hg), although other vacuum pressures are within the contemplated scope of the invention. In some embodiments of the invention, the semiconductor package assembly is left under vacuum for at least 10 minutes.

At block 606, the semiconductor package assembly is dried. In some embodiments of the invention, drying the semiconductor package assembly includes baking the semiconductor package assembly at a temperature between 85 to 120 degrees Celsius, although other drying temperatures are within the contemplated scope of the invention. In some embodiments of the invention, the semiconductor package assembly is baked for at least 8 hours, or at least 12 hours, or at least 24 hours.

At block 608, an epoxy is applied to a connector mating slot of the SMT DIMM. In some embodiments of the invention, the epoxy includes an epoxy resin having a specific gravity of about 1.17 and a polymercaptan hardener having a specific gravity of about 1.04.

At block 610, a dummy card stock is installed into the connector mating slot of the SMT DIMM while the epoxy is in an uncured state. At block 612, the epoxy is cured. In some embodiments of the invention, the epoxy is cured for a period of 24 hours at room temperature.

At block 614, a force is applied to an exposed cavity between the dummy card stock and the semiconductor package assembly to remove the SMT DIMM from the semiconductor package assembly. In some embodiments of the invention, removing the SMT DIMM from the semiconductor package assembly exposes one or more bottomside contacts. In some embodiments of the invention, applying a force to the exposed cavity includes inserting a pry tool into the cavity. In some embodiments of the invention, applying a force to the exposed cavity includes using a machine with a load cell such that the applied force can be monitored to provide analytical data.

At block 616, a surface of the semiconductor package assembly and the SMT DIMM are inspected for the dye, thereby locating the cracks. In some embodiments of the invention, the surface of the semiconductor package assembly and the surface of the SMT DIMM are inspected with an optical microscope for dye ingress.

Figure 7:
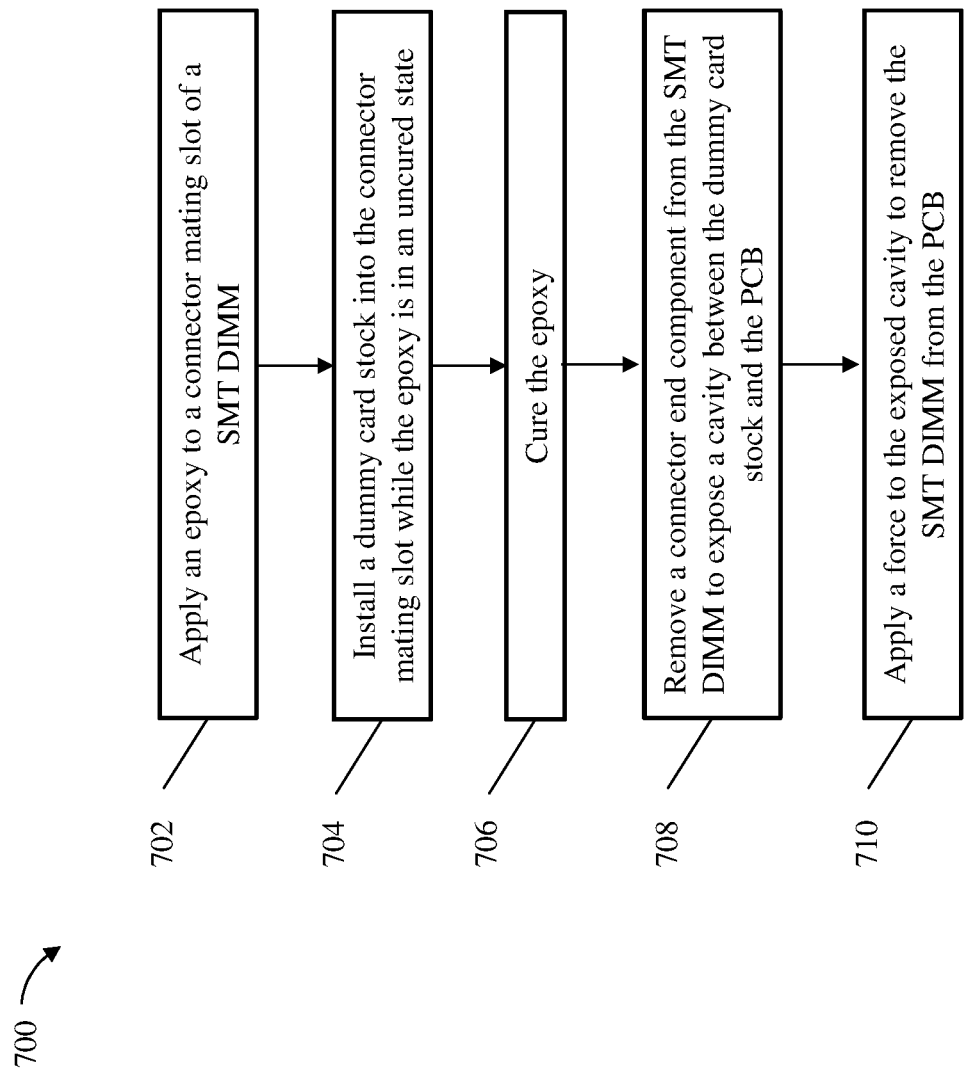
FIG. 7 depicts a flow diagram illustrating a method according to one or more embodiments of the invention.

FIG. 7 depicts a flow diagram 700 illustrating a method for removing a SMT DIMM from a PCB according to one or more embodiments of the invention. As shown at block 702, an epoxy is applied to a connector mating slot of the SMT DIMM.

At block 704, a dummy card stock is installed into the connector mating slot of the SMT DIMM while the epoxy is in an uncured state. At block 706, the epoxy is cured.

At block 708, a connector end component is removed from the SMT DIMM to expose a cavity between the dummy card stock and the PCB. The end component can be removed in a similar manner as discussed previously herein with respect to FIGS. 4A and 4B. In some embodiments of the invention, removing the connector end component includes removing a forklock or a PTH solder joint from an end of the SMT DIMM.

At block 710, a force is applied to the exposed cavity to remove the SMT DIMM from the PCB. In some embodiments of the invention, applying a force to the exposed cavity includes inserting a pry tool into the cavity. In some embodiments of the invention, applying a force to the exposed cavity includes using a machine with a load cell such that the applied force can be monitored to provide analytical data.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describe having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one"

and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of inspecting solder joints of a semiconductor package assembly having a surface mount technology (SMT) dual in-line memory module (DIMM), the method comprising:
   immersing the semiconductor package assembly in a solution comprising dye;
   placing the immersed semiconductor package assembly under a vacuum such that, when cracks exist in solder formed between the semiconductor package assembly and the SMT DIMM, the dye solution is pulled into the cracks;
   drying the semiconductor package assembly;
   applying an epoxy to a connector mating slot of the SMT DIMM;
   installing a dummy card stock into the connector mating slot of the SMT DIMM while the epoxy is in an uncured state;
   curing the epoxy;
   applying a force to an exposed cavity between the dummy card stock and the semiconductor package assembly to remove the SMT DIMM from the semiconductor package assembly; and
   inspecting a surface of the semiconductor package assembly and the SMT DIMM for the dye, thereby locating the cracks.

2. The method of claim 1, wherein removing the SMT DIMM from the semiconductor package assembly exposes one or more bottomside contacts of the semiconductor package assembly.

3. The method of claim 1, wherein inspecting the surface of the semiconductor package assembly for the dye comprises inspecting a surface of one or more exposed bottomside contacts of the semiconductor package assembly.

4. The method of claim 1, wherein the dye solution comprises red tracer dye.

5. The method of claim 1, wherein the vacuum comprises a vacuum pressure of about 27 inches of mercury (Hg).

6. The method of claim 1 further comprising leaving the semiconductor package assembly under the vacuum for at least 10 minutes.

7. The method of claim 1, wherein drying the semiconductor package assembly comprises baking the semiconductor package assembly at a temperature between 85 to 120 degrees Celsius.

8. The method of claim 7 further comprising baking the semiconductor package assembly for at least 8 hours.

9. The method of claim 1, wherein the epoxy comprises an epoxy resin having a specific gravity of about 1.17 and a polymercaptan hardener having a specific gravity of about 1.04.

10. The method of claim 1, wherein curing the epoxy comprises a 24-hour cure at room temperature.

11. The method of claim 1, wherein applying the force to the exposed cavity comprises inserting a pry tool into the cavity.

12. The method of claim 1, wherein applying the force to the exposed cavity comprises using a machine with a load cell such that the applied force can be monitored to provide analytical data.

13. The method of claim 1 wherein inspecting the surface of the semiconductor package assembly and the surface of the SMT DIMM is performed by an optical microscope.

* * * * *